(12) United States Patent
Sicard (10) Patent No.: US 8,384,579 B2
(45) Date of Patent: Feb. 26, 2013

(54) SYSTEMS AND METHODS FOR DATA CONVERSION

(75) Inventor: Thierry Sicard, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 93 days.

(21) Appl. No.: 13/186,106

(22) Filed: Jul. 19, 2011

(65) Prior Publication Data
US 2013/0021191 A1    Jan. 24, 2013

(51) Int. Cl.
H03M 1/66    (2006.01)

(52) U.S. Cl. ........ 341/172; 341/118; 341/120; 341/122; 341/143; 341/155

(58) Field of Classification Search .......... 341/118, 341/120, 122, 143, 155, 172
See application file for complete search history.

(56) References Cited

U.S. PATENT DOCUMENTS

| | | | | |
|---|---|---|---|---|
| 4,988,900 A * | 1/1991 | Fensch | ............ | 327/337 |
| 5,659,314 A * | 8/1997 | Tokura et al. | ............ | 341/143 |
| 5,729,232 A * | 3/1998 | Fujimori | ............ | 341/172 |
| 5,841,310 A * | 11/1998 | Kalthoff et al. | ............ | 327/337 |
| 6,535,039 B2 * | 3/2003 | Nanba et al. | ............ | 327/170 |
| 6,608,575 B2 * | 8/2003 | Bazarjani | ............ | 341/143 |
| 6,653,967 B2 * | 11/2003 | Hamashita | ............ | 341/172 |
| 7,242,333 B1 * | 7/2007 | Wu | ............ | 341/122 |
| 7,589,658 B2 * | 9/2009 | Ren et al. | ............ | 341/161 |
| 7,663,424 B2 | 2/2010 | Stulik | | |
| 7,982,526 B2 * | 7/2011 | Lee | ............ | 327/337 |
| 2003/0020530 A1 | 1/2003 | Lee et al. | | |
| 2005/0156657 A1 | 7/2005 | Budak et al. | | |
| 2008/0012741 A1 * | 1/2008 | Nakata et al. | ............ | 341/155 |
| 2010/0026542 A1 * | 2/2010 | Wang et al. | ............ | 341/155 |

OTHER PUBLICATIONS

U.S. Appl. No. 13/186,091, Inventor, Thierry Michel Sicard, "Systems and Methods for Data Conversion", filed Jul. 19, 2011, Office Action—Rejection, mailed Dec. 21, 2012.

* cited by examiner

*Primary Examiner* — Linh Nguyen
(74) *Attorney, Agent, or Firm* — Mary Jo Bertani (57) ABSTRACT

Systems and methods are provided for converting analog data to digital data that can include a discharge capacitor coupled to a voltage source. The voltage source supplies an initial data charge to the discharge capacitor; an amplifier coupled to the discharge capacitor; a divider circuit coupled to the amplifier; and a comparator coupled to the amplifier and the divider circuit. The divider circuit includes a first capacitor, a second capacitor, and a switch that is operated to alternately divide a remaining charge Q by $2^N$ using the first and second capacitors until the remaining data charge Qin at the amplifier is below a threshold value in the process of converting analog data to digital data.

20 Claims, 6 Drawing Sheets

SYSTEMS AND METHODS FOR DATA CONVERSION

CROSS-REFERENCE TO RELATED APPLICATION(S)

This application is related to U.S. patent application Ser. No. 13/186,091, filed on even date, entitled "Systems and Methods For Data Conversion," naming Thierry Sicard as inventor, and assigned to the current assignee hereof.

BACKGROUND

1. Field

This disclosure relates generally to electrical circuitry, and more specifically, to electrical circuitry for data conversion.

2. Related Art

Data converters are very useful for converting analog signals to digital signals, and for converting digital signals to analog signals. Many applications require data converters that have a high resolution, fast conversion time, allow a broad range of inputs, and yet are cost effective. Other data conversion features may also be important for various applications. It is thus important to be able to provide data converters that meet a wide variety of potentially conflicting criteria, while at the same time remain cost effective.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
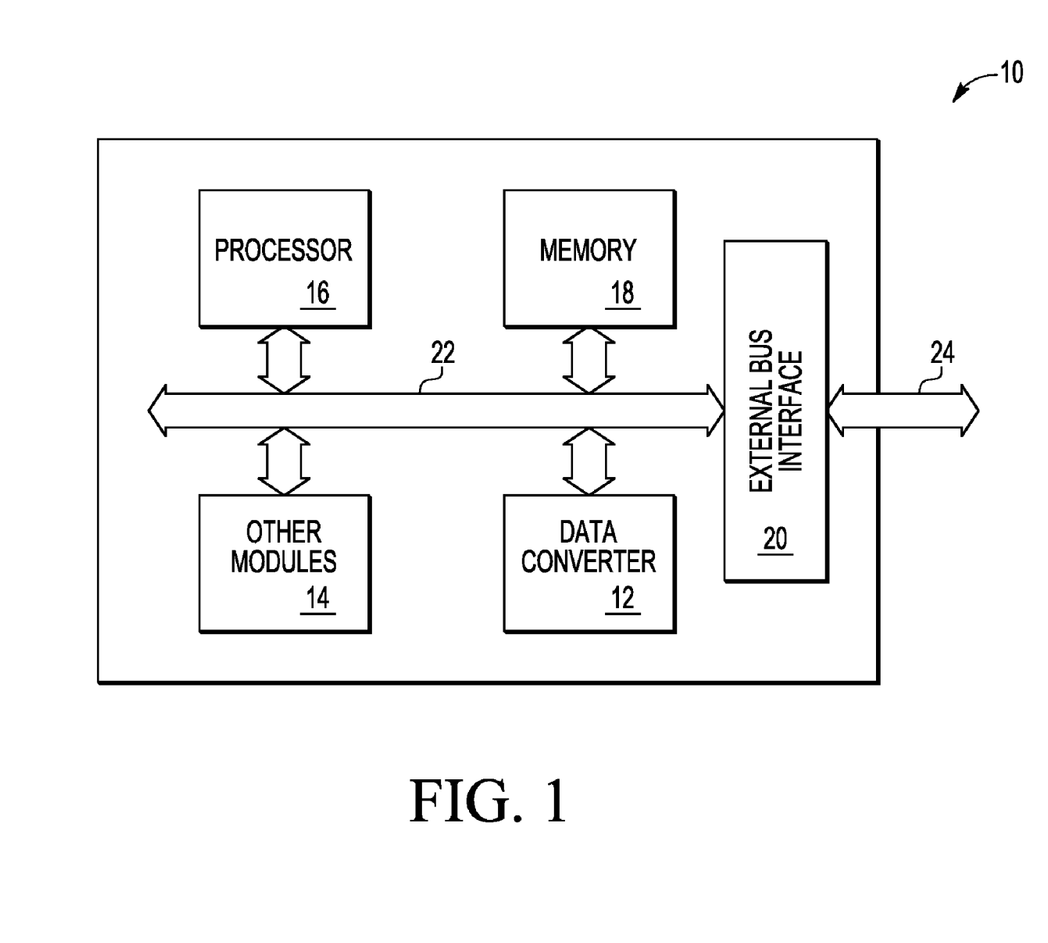
FIG. 1 illustrates, in block diagram form, a processing system in accordance with one embodiment.

FIG. 1 illustrates one embodiment of a processing system 10. In alternate embodiments, system 10 may be implemented as a semiconductor device as a single integrated circuit, may be implemented as a plurality of integrated circuits, or may be implemented as a combination of integrated circuits and discrete components. Alternate embodiments may implement system 10 in any manner.

In one embodiment, system 10 comprises data converter 12, other modules 14, processor 16, memory 18, and external bus interface 20, which are all bi-directionally coupled to each other by way of a bus 22 or a plurality of electrical signals 22. In one embodiment, system 10 can receive inputs and provide outputs by way of a bus 24 or a plurality of electrical signals 24 coupled to external bus interface 20. In alternate embodiments, system 10 may comprises fewer, more, or different blocks of circuitry than those illustrated in FIG. 1.

Figure 2:
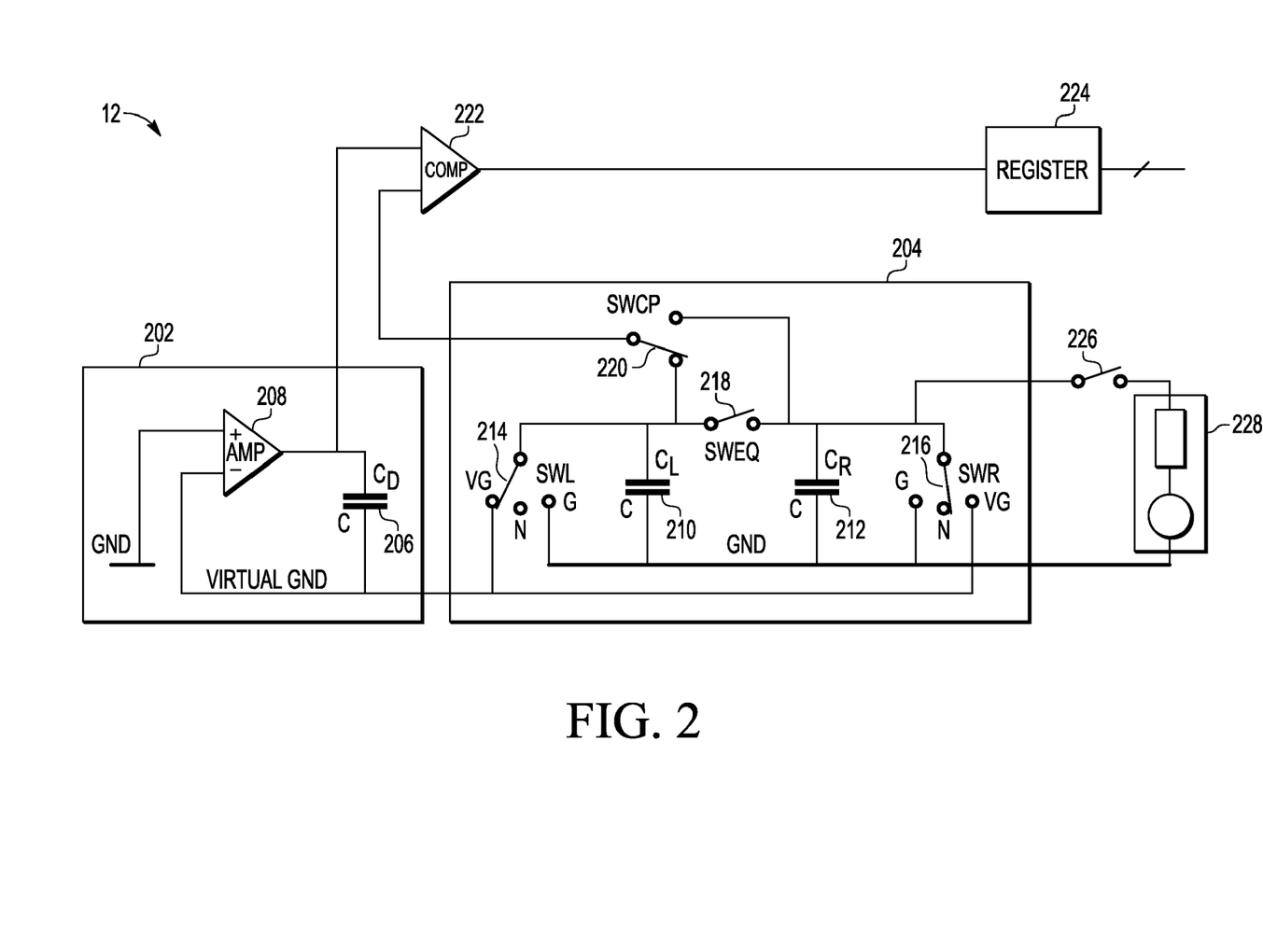
FIG. 2 illustrates, in schematic form, a portion of a data converter in accordance with one embodiment.

FIG. 2 illustrates, in schematic form, a portion of a data converter 12 in accordance with some embodiments that includes a discharge circuit 202 and a divider circuit 204 coupled to discharge circuit 202 via a first ground level VG. Discharge circuit 202 includes an amplifier 208 and a discharge capacitor 206. A first input of amplifier 208 is coupled to first ground level VG. Discharge capacitor 206 is coupled between an output of amplifier 208 and first ground level VG. Capacitors 206, 210, 212 are the same size or capacitance value (within manufacturing tolerances).

Divider circuit 204 includes a first divider capacitor 210, a first divider switch 214 coupled in parallel to first divider capacitor 210, a second divider capacitor 212 coupled in parallel to first divider capacitor 210, second divider switch 216 coupled in parallel to the second divider capacitor 212, and a third divider switch 218 coupled in series between first divider capacitor 210 and second divider capacitor 212. First divider switch 214 is coupled between first ground level VG and third divider switch 218, second divider switch 216 is coupled between the first ground level and the third divider switch 218, and first and second divider capacitors 210, 212 are coupled between a second ground level G and third divider switch 218.

Data converter 12 further includes a comparator 222 that has a first input coupled to the output of amplifier 208 and a second input coupled to an output of divider circuit 204. A fourth switch 220 is coupled to the second comparator input. Fourth switch 220 includes one terminal coupled between first divider capacitor 210 and third divider switch 218, and a second terminal coupled between second divider capacitor 212 and third divider switch 218.

First and second divider switches 214, 216 can operate between respective first, second and/or third positions. The first position couples the first and second divider switches 214, 216 to first ground level VG, the second position couples first and second divider switches 214, 216 to the second ground level G, and the third position couples first and second divider switches 214, 216 to a neutral position between the first and second ground positions. Switch 220 can be operated to make divider circuit 204 symmetric by bringing the same capacitive load to both divider capacitors 210, 212 when switch 218 is closed.

A power supply 228 can be coupled to divider circuit 204 to pre-charge capacitor 212 during initialization. In the embodiment shown, power supply 228 is coupled in parallel with capacitor 212 and switch 216. An initialization switch 226 can be included to connect power supply 228 to divider circuit 204 during initialization and to disconnect power supply 228 after initialization.

Figure 3:
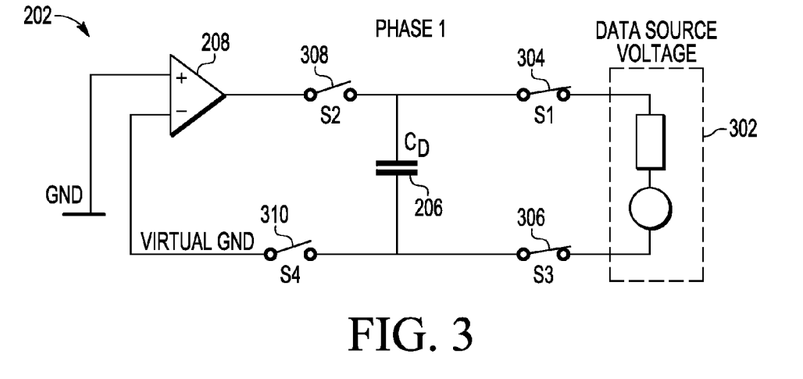
FIGS. 3-5 illustrate, in schematic diagram form, a pre-charge portion of the data converter of FIGS. 1 and 2 in accordance with one embodiment.
Figure 4:
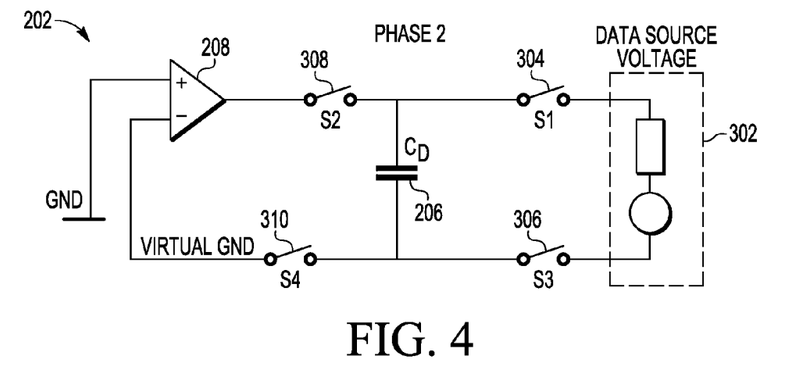
Figure 5:
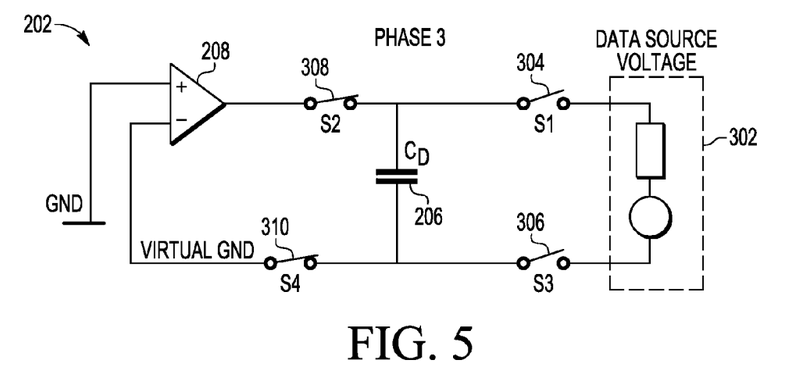

FIGS. 3-5 illustrate, in schematic diagram form, an example of a pre-charge portion for discharge circuit 202 of data converter 12 of FIGS. 1 and 2 including a voltage source 302 coupled in parallel with discharge capacitor 206. A first discharge switch 304 coupled in series with the output of amplifier 208 and between discharge capacitor 206 and voltage source 302. A second discharge switch 306 is coupled in series with the first input to amplifier 208 and between discharge capacitor 206 and voltage source 302. A third discharge switch 308 is coupled in series with the output of amplifier 208 and between the discharge capacitor 206 and amplifier 208. A fourth discharge switch 310 is coupled in series with the first input to amplifier 208 and between discharge capacitor 206 and amplifier 208.

During a first pre-charge phase of operation as shown in FIG. 3, switches 304, 306 are closed and switches 308 and 310 are open to load discharge capacitor 208 with data voltage from voltage source 302. During a second phase of operation as shown in FIG. 4, switches 304, 306, 308, 310 are open to isolate discharge capacitor 206 from voltage source 302. During a third phase of operation as shown in FIG. 5, switches 304, 306 are open and switches 308, 310 are closed to load discharge capacitor 206 across amplifier 208.

Figure 6:
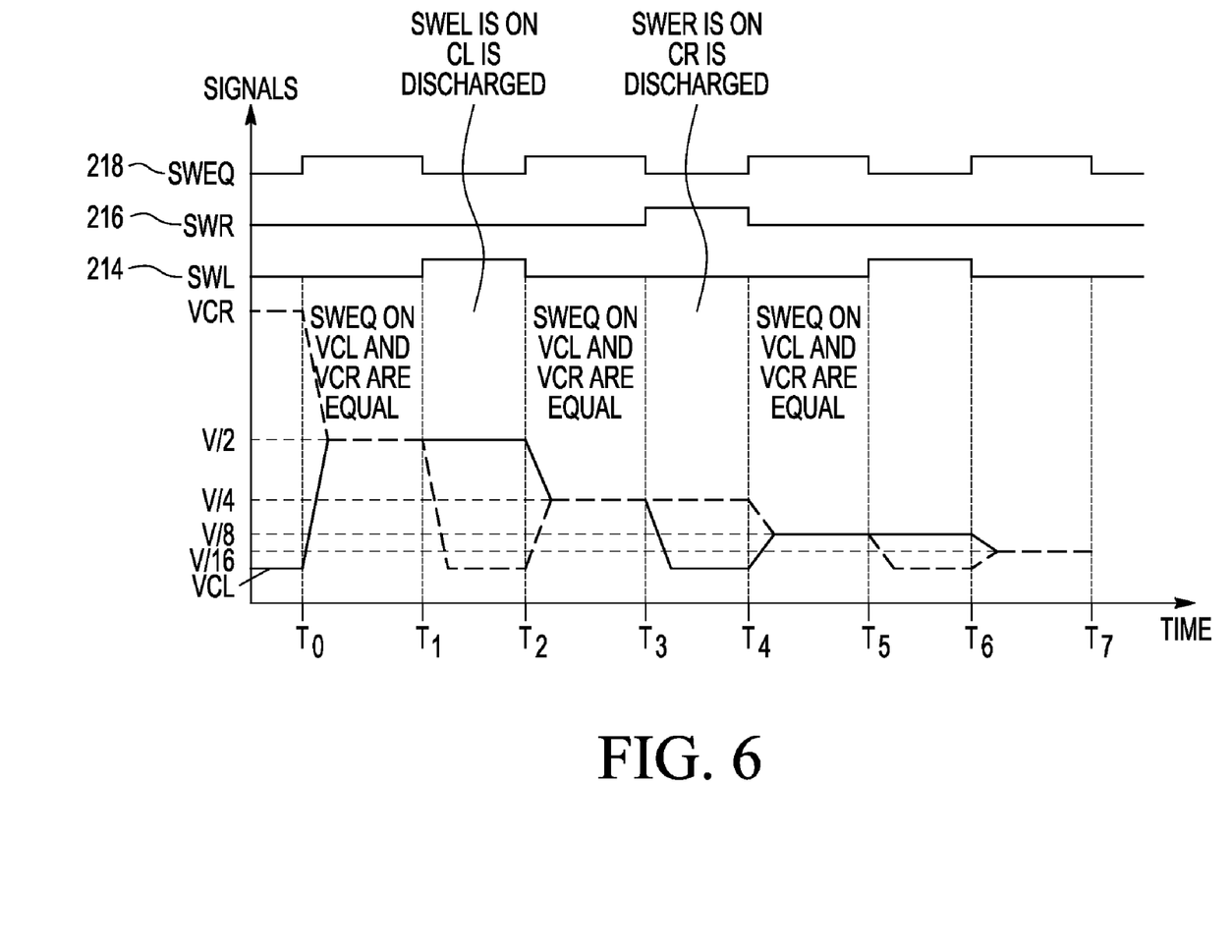
FIG. 6 illustrates, in time history diagram form, an example of the operation of switches and capacitors in the portion of the data converter of FIGS. 3-5.

FIG. 6 illustrates, in time history diagram form, an example of voltages across capacitors 210, 212 resulting from the operation of switches 214, 216, 218 in data converter 12 of FIG. 2. FIGS. 7-14 illustrate, in conjunction with FIG. 6, examples of voltages or charges stored in the capacitors of the data converter 12 of FIG. 2 during operation of switches 214, 216, 218. Note that while FIGS. 7-14 show the discharge of capacitor 210 during certain phases of operation, the alternate discharge of capacitor 212 is not shown, but is similar to the discharge of capacitor 210 during alternating phases.

Figure 7:
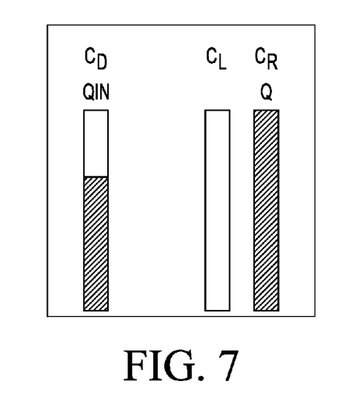
FIGS. 7-14 illustrate, in graphical form, an example of charges stored in the capacitors of the data converter of FIG. 2 during different phases of operation.

FIGS. 6 and 7 show that prior to $T_0$, discharge capacitor 206 is partially charged to input charge Qin and divider capacitor 212 is fully charged to charge Q. Divider capacitor 210 is initially discharged. When switch 218 is closed at time $T_0$, switches 214, 216 are open and since capacitors 210, 212 are approximately the same size, the charge Q from capacitor 212 is divided by two, with one half of the charge Q being transferred to capacitor 210 and the other half remaining in capacitor 212, as shown in FIG. 8.

Figure 8:
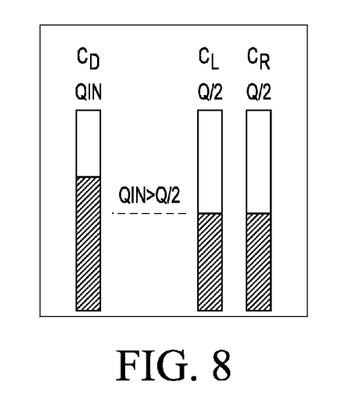
Figure 9:
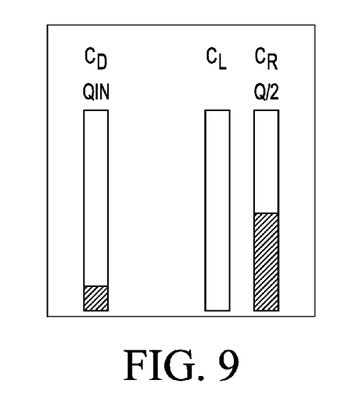

Referring to FIGS. 6, 8 and 9, when switch 218 opens at time $T_1$, switch 214 closes to connect capacitor 210 to the first ground VG. Switch 216 remains open causing capacitor 212 retains its charge while capacitor 210 is discharged with the switch 214 in the ground G position. As shown in FIG. 9, the charge from capacitor 210 is removed from capacitor 206 via common series connection of capacitors 206, 210 to first ground VG since the charge in capacitor 206 (Qin) was greater than the charge in capacitor 210 (Q/2). With respect to comparator 222, when the charge in capacitor 206 is greater than the charge in capacitor 210, comparator 222 sets a bit for the corresponding charge level (in this case, Q/2).

Figure 10:
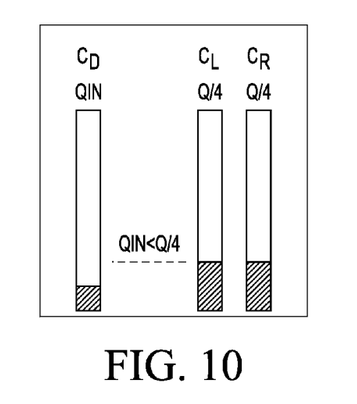

Referring to FIGS. 6, 9 and 10, when switch 218 is closed at time $T_2$, switch 214 opens and switch 216 remains open causing the remaining charge (Q/4) on capacitor 212 to be divided between capacitors 210, 212, as shown in FIG. 10.

Figure 11:
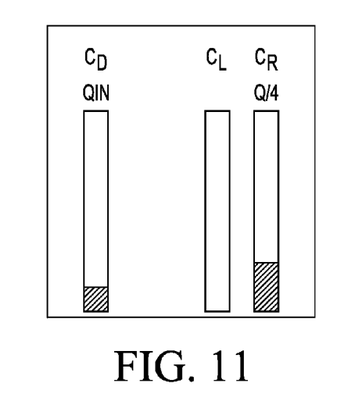

Referring to FIGS. 6, 10 and 11, when switch 218 opens at time $T_3$, switch 214 closes and switch 216 remains open causing capacitor 210 to be discharged, as shown in FIG. 11.

Figure 12:
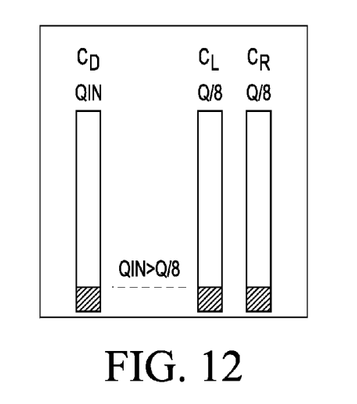

Referring to FIGS. 6, 11 and 12, when switch 218 is closed at time $T_4$, switch 216 opens and switch 214 remains open causing the remaining charge (Q/8) on capacitor 212 to be divided between capacitors 210, 212, as shown in FIG. 12.

Figure 13:
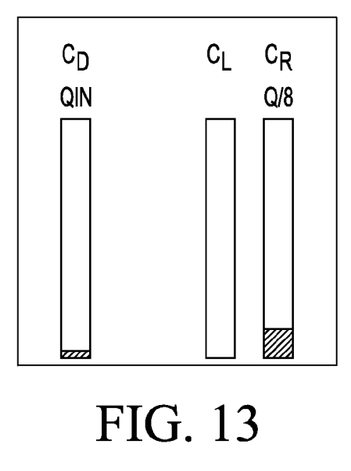

Referring to FIGS. 6, 12 and 13, when switch 218 opens at time $T_5$, switch 214 closes and switch 216 remains open causing the charge on capacitor 212 to be discharged, as shown in FIG. 13.

Figure 14:
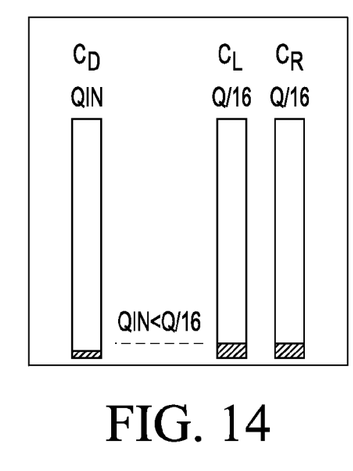

Referring to FIGS. 6, 13 and 14, when switch 218 closes at time $T_6$, switch 214 opens and switch 216 remains open causing the remaining charge (Q/16) on capacitor 212 to be divided between capacitors 210, 212, as shown in FIG. 14.

Data converter 12 solves or improves the problem of error-prone multiplication of the factor 2 (used in the $2^N$ division) that plague conventional data converters. Additionally, problems associated with achieving matching capacitors in conventional data converters (i.e., successive approximation registers) are minimized by data converter 12 that can use only three capacitors 206, 210, 212 having the same capacitance, value, or size (within limits of manufacturing tolerances). Further, capacitors 206, 210, 212 can be relatively large since there are only three of them, enabling better size matching and lower noise. As a further feature, data converter 12 is much easier to test than conventional data converters since only three capacitors 206, 210, 212 and four switches 215, 216, 218, 220 need to be tested instead of the much more numerous capacitors and switches found in conventional data converters.

As a further feature, error between capacitors 210, 212 is compensated by the alternative discharge of capacitors 210, 212 since the error is not accumulated. Additionally, all capacitors are connected to a first or second ground level, so data converter 12 does not induce parasitic capacitor with a substrate upon which semiconductor devices such as processing system 10 are fabricated. Further, switch 218 does not inject parasitic charges, because switch 218 is turned on and off before comparator 222 measures the difference between inputs.

By now it should be appreciated that there has been provided a data converter 12 with a number of beneficial features. Data converter 12 requires only three capacitors 206, 210, 212 having the same or approximately the same value. Capacitors 210, 212 generate $Q/2^N$ charges while capacitor 206 stores the analog data charge $Qin=C_{Discharge}V_{data}$. Amplifier 208 removes the charge from capacitor 206 and comparator 222 compares the data charges Qin with the charges of capacitors 210, 212 in divider circuit 204.

In some embodiments, a semiconductor device 10 comprises a discharge capacitor 206 coupled to a voltage source 302. The voltage source 302 supplies an initial data charge Qin to the discharge capacitor 206. Amplifier 208 is coupled to the discharge capacitor 206. Divider circuit 204 is coupled to the amplifier 208. Comparator 222 is coupled to the amplifier 208 and the divider circuit 204. The divider circuit 204 includes a first capacitor 210, a second capacitor 212, and a switch 214 that is operated to alternately divide a remaining charge Q by $2^N$ using the first and second capacitors until the remaining charge Qin at the amplifier is below a threshold value in the process of converting analog data to digital data.

In other aspects, a first set of switches 308, 310 can be configured to isolate amplifier 208 from the discharge capacitor 206 while the voltage source 302 applies an initial data charge Qin to the discharge capacitor 206.

In other aspects, a second set of switches 304, 306 can be coupled in series between the voltage source 302 and discharge capacitor 206 and configured to isolate the discharge capacitor 206 from the voltage source 302.

In still other aspects, the first set of switches 308, 310 and the second set of switches 304, 306 can be configured to load voltage from the discharge capacitor 206 across the amplifier 208.

In further aspects, the divider circuit 204 is coupled to the discharge capacitor 206 and the amplifier 208 via a first ground level. The semiconductor device further comprises a first divider switch 214 coupled between the first ground level and the switch 218, and the first and second divider capacitors 210, 212 are coupled between a second ground level and the switch 218.

In other embodiments, a method for converting an analog signal to a digital signal in a processing system comprises charging a discharge capacitor 206 to an initial data charge Qin with a voltage source 302; and performing N successive analog subtractions from the initial data charge Qin, wherein the analog subtractions are performed using an amplifier coupled to the discharge capacitor and a divider circuit coupled to the amplifier, and the divider circuit includes a first capacitor 210, a second capacitor 212, and a switch 214 to alternately divide a remaining charge Q by $2^N$ using the first and second capacitors until the remaining charge Q at the amplifier is below a threshold value.

In other aspects, the method can include operating a first set of switches 308, 310 to isolate an amplifier from the discharge capacitor while the voltage source applies the Qin to the discharge capacitor.

In still other aspects, the method can include operating a second set of switches 304, 306 coupled in series between the voltage source 302 and discharge capacitor 206 to isolate the discharge capacitor 206 from the voltage source 302.

In still other aspects, the method can include operating the first set of switches 308, 310 and the second set of switches to load voltage from the discharge capacitor across the amplifier.

In still other aspects, the method can include testing functional capability of analog to digital conversion by applying a variety of different initial charges to the amplifier the discharge capacitor.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Some of the above embodiments, as applicable, may be implemented using a variety of different information processing systems. For example, although FIGS. 1 and 2 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 18 may be located on a same integrated circuit as processor 16 or on a separate integrated circuit or located within another peripheral or slave discretely separate from other elements of system 10. Data converter 12 may also be located on a separate integrated circuit or device. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. For example, any one or more of the features described herein may be used in any desired and appropriate combination with any other features. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-transitory computer processing system comprising:
    an analog to digital converter ADC circuit that includes:
        a discharge circuit including:
            an amplifier, wherein a first input of the amplifier is coupled to a first ground level, and
            a discharge capacitor coupled between an output of the amplifier and the first ground level; and
        a divider circuit coupled to the discharge circuit via the first ground level, the divider circuit including:
        a first divider capacitor,
        a first divider switch coupled in parallel to the first divider capacitor,
        a second divider capacitor coupled in parallel to the first divider capacitor,
        a third divider switch coupled in series between the first divider capacitor and the second divider capacitor,
        wherein the first divider switch is coupled between the first ground level and the third divider switch, and the first and second divider capacitors are coupled between a second ground level and the third divider switch.

2. The non-transitory computer processing system of claim 1 further comprising:
    a second divider switch coupled in parallel to the second divider capacitor, wherein the second divider switch is coupled between the first ground level and the third divider switch.

3. The non-transitory computer processing system of claim 1 further comprising:
    a comparator including a first comparator input and a second comparator input, wherein the first comparator input is coupled to the output of the amplifier and the second comparator input is coupled to an output of the divider circuit.

4. The non-transitory computer processing system of claim 1 further comprising:
a fourth switch coupled to the second comparator input, the fourth switch including one terminal coupled between the first divider capacitor and the third divider switch, and a second terminal coupled between the second divider capacitor and the third divider switch.

5. The non-transitory computer processing system of claim 2 wherein the first and second divider switches operate between respective first and second positions,
the first position couples the first and second divider switches to the first ground level, and
the second position couples the first and second divider switches to the second ground level.

6. The non-transitory computer processing system of claim 5 wherein the first and second divider switches operate between the respective first and second positions and a third position, the third position couples the first and second divider switches to a neutral position.

7. The non-transitory computer processing system of claim 3, wherein the only capacitors used for analog to data conversion are the discharge capacitor and the first and second divider capacitors.

8. The non-transitory computer processing system of claim 1 wherein the discharge circuit further includes:
a voltage source coupled in parallel with the discharge capacitor.

9. The non-transitory computer processing system of claim 1 wherein the discharge circuit further includes:
a first discharge switch coupled in series with the output of the amplifier and between the discharge capacitor and the voltage source;
a second discharge switch coupled in series with the first input to the amplifier and between the discharge capacitor and the voltage source;
a third discharge switch coupled in series with the output of the amplifier and between the discharge capacitor and the amplifier; and
a fourth discharge switch coupled in series with the first input to the amplifier and between the discharge capacitor and the amplifier.

10. The non-transitory computer processing system of claim 1 wherein the first and second divider capacitors generate successive $Q/2^N$ charges that are removed from the discharge capacitor through the amplifier.

11. A method for converting an analog signal to a digital signal in a processing system comprising:
charging a discharge capacitor to an initial data charge Qin with a voltage source; and
performing N successive analog subtractions from the initial data charge Qin, wherein the analog subtractions are performed using an amplifier coupled to the discharge capacitor and a divider circuit coupled to the amplifier, and the divider circuit includes a first capacitor, a second capacitor, and a switch to alternately divide a remaining charge Q by $2^N$ using the first and second capacitors until the remaining charge Qin at the amplifier is below a threshold value.

12. The method of claim 11 further comprising:
operating a first set of switches to isolate an amplifier from the discharge capacitor while the voltage source applies the Qin to the discharge capacitor.

13. The method of claim 12 further comprising:
operating a second set of switches coupled in series between the voltage source and discharge capacitor to isolate the discharge capacitor from the voltage source.

14. The method of claim 13 further comprising:
operating the first set of switches and the second set of switches to load voltage from the discharge capacitor across the amplifier.

15. The method of claim 11 further comprising:
testing functional capability of analog to digital conversion by applying a variety of different initial charges to the amplifier the discharge capacitor.

16. A semiconductor device comprising:
a discharge capacitor coupled to a voltage source, wherein the voltage source supplies an initial data charge to the discharge capacitor;
an amplifier coupled to the discharge capacitor;
a divider circuit coupled to the amplifier; and
a comparator coupled to the amplifier and the divider circuit, wherein the divider circuit includes a first capacitor, a second capacitor, and a switch that is operated to alternately divide a remaining charge Q by $2^N$ using the first and second capacitors until the remaining charge Qin at the amplifier is below a threshold value in the process of converting analog data to digital data.

17. The semiconductor device of claim 16 further comprising:
a first set of switches configured to isolate an amplifier from the discharge capacitor while the voltage source applies an initial charge Qin to the discharge capacitor.

18. The semiconductor device of claim 17 further comprising:
a second set of switches coupled in series between the voltage source and discharge capacitor and configured to isolate the discharge capacitor from the voltage source.

19. The semiconductor device of claim 18 further comprising:
the first set of switches and the second set of switches are configured to load voltage from the discharge capacitor across the amplifier.

20. The semiconductor device of claim 16 wherein the divider circuit is coupled to the discharge capacitor and the amplifier via a first ground level, the semiconductor device further comprising:
a first divider switch coupled between the first ground level and the switch, and the first and second divider capacitors are coupled between a second ground level and the switch.

* * * * *